(12) United States Patent
Kubo

(10) Patent No.: US 7,477,519 B2
(45) Date of Patent: Jan. 13, 2009

(54) ELECTRONIC COMPONENT PACKAGE INCLUDING HEAT SPREADING MEMBER

(75) Inventor: Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/262,999

(22) Filed: Oct. 28, 2005

(65) Prior Publication Data

US 2006/0146503 A1    Jul. 6, 2006

Related U.S. Application Data

(63) Continuation of application No. PCT/JP03/04852, filed on Apr. 16, 2003.

(51) Int. Cl.
*H05K 7/20*    (2006.01)
*H01L 23/34*   (2006.01)

(52) U.S. Cl. .............. 361/719; 361/704; 361/709; 361/710; 257/708; 257/718; 257/719; 165/80.3; 165/104.33; 165/185; 174/15.1; 174/16.3; 174/252

(58) Field of Classification Search .......... 361/704, 361/707, 710, 719, 720; 257/706–707, 712–714, 257/718–719, 704
See application file for complete search history.

(56) References Cited

U.S. PATENT DOCUMENTS

| | | | | |
|---|---|---|---|---|
| 4,442,450 A | * | 4/1984 | Lipschutz et al. | 257/713 |
| 4,899,210 A | * | 2/1990 | Lorenzetti et al. | 257/712 |
| 5,200,365 A | * | 4/1993 | Culver | 156/60 |
| 5,227,663 A | * | 7/1993 | Patil et al. | 257/718 |
| 5,384,940 A | * | 1/1995 | Soule et al. | 24/453 |
| 5,448,107 A | * | 9/1995 | Osada et al. | 257/706 |
| 5,644,163 A | * | 7/1997 | Tsuji | 257/706 |
| H1699 H | * | 12/1997 | Vavrick | 156/276 |
| 5,699,610 A | | 12/1997 | Shimada et al. | |

(Continued)

FOREIGN PATENT DOCUMENTS

JP    2-220465 A    9/1990

(Continued)

OTHER PUBLICATIONS

Japanese Office Action dated Mar. 11, 2008, issued in corresponding Japanese patent application No. 2004-570891.

(Continued)

*Primary Examiner*—Michael V Datskovskiy
(74) *Attorney, Agent, or Firm*—Westerman, Hattori, Daniels & Adrian, LLP.

(57) ABSTRACT

A heat spreading member is received on a predetermined surface of an electronic component. The heat spreading member extends larger than the predetermined surface. A contact piece is contacted with the heat spreading member over a contact area smaller than the predetermined surface. The contact piece serves to realize concentration of an urging force applied to the heat spreading member. The heat spreading member is thus reliably urged against the electronic component. The concentration of the urging force serves to prevent the heat spreading member and the electronic component from camber even if heat is applied to the heat spreading member and the electronic component. Separation is thus avoided between the heat spreading member and the electronic component. The heat spreading member reliably keeps contacting with the electronic component, so that the electronic component package is allowed to enjoy improvement in heat radiation.

17 Claims, 3 Drawing Sheets

U.S. PATENT DOCUMENTS

| | | | | |
|---|---|---|---|---|
| 5,781,412 A | * | 7/1998 | de Sorgo | 361/704 |
| 5,783,862 A | * | 7/1998 | Deeney | 257/714 |
| 5,786,635 A | | 7/1998 | Alcoe et al. | |
| 5,814,535 A | | 9/1998 | Shimada et al. | |
| 5,838,064 A | | 11/1998 | Shimada et al. | |
| 5,863,814 A | | 1/1999 | Alcoe et al. | |
| 5,870,286 A | * | 2/1999 | Butterbaugh et al. | 361/704 |
| 6,081,027 A | * | 6/2000 | Akram | 257/707 |
| 6,087,597 A | | 7/2000 | Shimada et al. | |
| 6,111,322 A | * | 8/2000 | Ando et al. | 257/778 |
| 6,218,730 B1 | | 4/2001 | Toy et al. | 257/704 |
| 6,245,186 B1 | | 6/2001 | Alcoe et al. | |
| 6,255,136 B1 | | 7/2001 | Alcoe et al. | |
| 6,271,581 B2 | * | 8/2001 | Huang et al. | 257/666 |
| 6,380,621 B1 | * | 4/2002 | Ando et al. | 257/707 |
| 6,380,622 B1 | * | 4/2002 | Hirai et al. | 257/712 |
| 6,442,026 B2 | | 8/2002 | Yamaoka | |
| 6,469,893 B1 | * | 10/2002 | Frutschy et al. | 361/700 |
| 6,559,525 B2 | * | 5/2003 | Huang | 257/675 |
| 6,570,764 B2 | * | 5/2003 | Bhatia et al. | 361/705 |
| 6,600,652 B2 | * | 7/2003 | Chandran et al. | 361/704 |
| 6,649,443 B2 | * | 11/2003 | Gektin | 438/106 |
| 6,654,250 B1 | * | 11/2003 | Alcoe | 361/719 |
| 6,661,660 B2 | * | 12/2003 | Prasher et al. | 361/700 |
| 6,665,187 B1 | * | 12/2003 | Alcoe et al. | 361/719 |
| 6,672,892 B2 | * | 1/2004 | Chandran et al. | 439/330 |
| 6,717,246 B2 | * | 4/2004 | Budelman | 257/678 |
| 6,757,170 B2 | * | 6/2004 | Lee et al. | 361/704 |
| 6,774,482 B2 | * | 8/2004 | Colgan et al. | 257/712 |
| 6,785,137 B2 | * | 8/2004 | Siegel | 361/704 |
| 6,791,839 B2 | * | 9/2004 | Bhagwagar | 361/705 |
| 6,867,978 B2 | * | 3/2005 | Whittenburg et al. | 361/719 |
| 7,190,585 B2 | * | 3/2007 | Houle | 361/704 |
| 2005/0133907 A1 | * | 6/2005 | Hildner et al. | 257/717 |
| 2006/0185836 A1 | * | 8/2006 | Garner | 165/185 |

FOREIGN PATENT DOCUMENTS

| | | |
|---|---|---|
| JP | 3-85652 | 8/1991 |
| JP | 3-180054 | 8/1991 |
| JP | 5-021663 A | 1/1993 |
| JP | 8-088302 A | 4/1996 |
| JP | 10-032305 A | 2/1998 |
| JP | 10-189839 A | 7/1998 |
| JP | 2000-174182 A | 6/2000 |
| JP | 2000232190 A * | 8/2000 |
| JP | 2001-177017 | 6/2001 |

OTHER PUBLICATIONS

Japanese Office Action dated Jul. 22, 2008, issued in corresponding Japanese patent application No. 2004-570891.

* cited by examiner

ELECTRONIC COMPONENT PACKAGE INCLUDING HEAT SPREADING MEMBER

This application is a continuation of international application PCT/JP2003/004852 filed on Apr. 16, 2003.

BACKGROUND OF THE INVENTION

1. Field of the Invention

The present invention relates to a printed circuit board unit including a printed wiring board and an electronic component package mounted on the printed wiring board. The electronic component package includes a heat spreading member covering over a predetermined surface of an electronic component such as a LSI (Large-Scale Integrated circuit) chip. The heat spreading member extends larger than the predetermined surface of the electronic component.

2. Description of the Prior Art

A LSI package includes a LSI chip mounted on a small-sized printed wiring board. A heat spreading member or heat spreader is received on the upper surface of the LSI chip. A solidified material, such as a solidified silver paste, a solidified diamond paste, or the like, having heat conductivity is interposed between the LSI chip and the heat spreader. The solidified material serves to improve an efficient transfer of heat from the LSI chip to the heat spreader. The heat is allowed to spread over a larger or wider area of the heat spreader.

The small-sized printed wiring board may utilize a substrate made of resin in the LSI package, for example. Such a substrate, however, tends to suffer from a larger expansion as compared with the LSI chip in response to a rise in temperature of the LSI chip, for example, because of the linear expansivity larger than that of the LSI chip. This results in a slight camber of the substrate. The camber of the substrate causes separation between the heat spreader and the solidified material. An efficient transfer of heat cannot thus be accomplished between the LSI chip and the heat spreader.

SUMMARY OF THE INVENTION

It is accordingly an object of the present invention to provide an electronic component package as well as an electronic component package assembly both capable of reliably transferring heat from an electronic component to a heat spreading member. It is also an object of the present invention to provide a printed circuit board unit greatly contributing to improvement of heat radiation from the electronic component package such as a LSI package.

According to a first aspect of the present invention, there is provided a printed circuit board unit comprising: a printed wiring board; an electronic component package mounted on the surface of the printed wiring board, said electronic component package allowing a heat spreading member to cover over an electronic component, said heat spreading member extending larger than a predetermined surface of the electronic component; a contact piece contacting with the surface of the heat spreading member over a contact area smaller than the predetermined surface of the electronic component; and a heat radiation member defining a flat surface opposed to the surface of the heat spreading member at a position adjacent to the contact piece.

The printed circuit board unit allows concentration of an urging force at the contact area between the heat spreading member and the contact piece when the urging force is applied to the heat spreading member through the contact piece. The heat spreading member is thus reliably urged against the electronic component.

Now, assume that the electronic component generates heat. The generated heat is transferred to the heat spreading member. The heat is allowed to spread over a larger or wider area of the heat spreading member since the heat spreading member extends larger than the predetermined surface of the electronic component. The spread heat is then transferred to the heat radiation member. The heat radiation member serves to radiate the heat into air. The electronic component is in this manner efficiently prevented from a rise in temperature.

The heat of the electronic component simultaneously induces deformation of the electronic component package. Since the contact piece realizes concentration of the urging force on the heat spreading member as well as on the electronic component, the heat spreading member and the electronic component are thus reliably prevented from camber. Separation is thus avoided between the heat spreading member and the electronic component. The heat spreading member reliably keeps contacting with the electronic component, so that the electronic component package is allowed to enjoy improvement in heat radiation. This results in a sufficient suppression of a rise in temperature of the electronic component.

In this case, the contact piece may contact with the surface of the heat spreading member in a section defined on the surface of the heat spreading member based on the projected image of the electronic component. This enables concentration of the urging force on the heat spreading member. The heat spreading member is thus reliably urged against the surface of the electronic component. The contact piece may be integral with the heat radiating member so as to establish a one-piece component. Alternatively, the contact piece may be made of a metallic mass separate from the heat radiation member.

A heat conductive fluid may be interposed between the surface of the heat spreading member and the heat radiation member. The fluid may contain fine particles having heat conductivity and dispersed in the fluid, and a grain having a size larger than that of the fine particles so as to serve as the contact piece in the fluid. A solidified material having heat conductivity may be interposed between the surface of the electronic component and the heat spreading member.

The printed circuit board unit may further comprise: a spring having one end supported on the surface of the heat radiation member, said spring having the other end distanced from the heat radiation member based on elasticity; and a restraint member holding the other end of the spring in a direction distanced form the printed wiring board. The spring and the restrain member in combination enable establishment of a sufficient urging force applied to the contact piece through the heat radiation member. The heat spreading member is allowed to enjoy concentration of the urging force through the contact piece.

An electronic component package assembly of a specific type can be utilized for realization of the aforementioned printed circuit board unit. The electronic component package assembly may comprise: a heat spreading member received on a predetermined surface of an electronic component, said heat spreading member extending larger than the predetermined surface of the electronic component; and a contact piece contacting with the surface of the heat spreading member over a contact area smaller than the predetermined surface of the electronic component. The contact piece may contact with the surface of the heat spreading member in a section defined on the surface of the heat spreading member based on the projected image of the electronic component.

The electronic component package assembly may further comprise a heat radiation member defining a flat surface opposed to the surface of the heat spreading member at a position adjacent to the contact piece. The contact piece may be integral with the heat radiation member so as to establish a one-piece component. Alternatively, the contact piece may be made of a metallic mass separate from the heat radiation member. A heat conductive fluid may be interposed between the surface of the heat spreading member and the heat radiation member. The fluid may contain fine particles dispersed in the fluid, and a grain having a size larger than that of the fine particles so as to serve as the contact piece in the fluid. The solidified material having heat conductivity may be interposed between the surface of the electronic component and the heat spreading member. The electronic component package assembly may further comprise an urging mechanism related to the contact piece. The urging mechanism is designed to apply an urging force to the contact piece toward the surface of the electronic component.

According to a second aspect of the present invention, there is provided a printed circuit board unit comprising: a printed wiring board; an electronic component package mounted on the surface of the printed wiring board, said electronic component package allowing a heat spreading member to cover over an electronic component, said heat spreading member extending larger than a predetermined surface of the electronic component; a contact piece contacting with the surface of the heat spreading member over a contact area smaller than the predetermined surface of the electronic component; and a heat radiation member defining a flat surface opposed to the surface of the heat spreading member at a position adjacent to the contact piece.

The printed circuit board unit allows concentration of an urging force at the contact piece on the heat spreading member when the urging force is applied to the heat spreading member through the contact piece. The heat spreading member is thus reliably urged against the surface of the electronic component. The heat spreading member and the electronic component are thus reliably prevented from camber because of the concentrated urging force applied to the heat spreading member as well as the electronic component through the contact piece. Separation is thus avoided between the heat spreading member and the electronic component. The heat spreading member reliably keeps contacting with the electronic component, so that the electronic component package is allowed to enjoy improvement in heat radiation. This results in a sufficient suppression of a rise in temperature of the electronic component.

In this case, the contact piece may have an extent smaller than the predetermined surface of the electronic component. The contact piece may be located in a section defined on the flat upward surface of the heat spreading member based on the projected image of the electronic component. The solidified material having heat conductivity may be interposed between the surface of the electronic component and the heat spreading member.

An electronic component package of a specific type can be utilized for realization of the aforementioned printed circuit board unit. The electronic component package may comprise: a printed wiring board; an electronic component mounted on the surface of the printed wiring board; a heat spreading member received on the surface of the electronic component on the printed wiring board, said heat spreading member defining an upward surface having the outer periphery extending in an imaginary plane; and a contact piece integrally formed on the upward surface of the heat spreading member, said contact piece defining the upper end located above the imaginary plane.

The upper end of the contact piece may have an extent smaller than the predetermined surface of the electronic component. The upper end of the contact piece may be located in a section defined on the flat upward surface of the heat spreading member based on the projected image of the electronic component. The heat spreading member may have a flat surface at a position adjacent to the contact piece. A solidified material having heat conductivity may be interposed between the surface of the electronic component and the heat spreading member.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
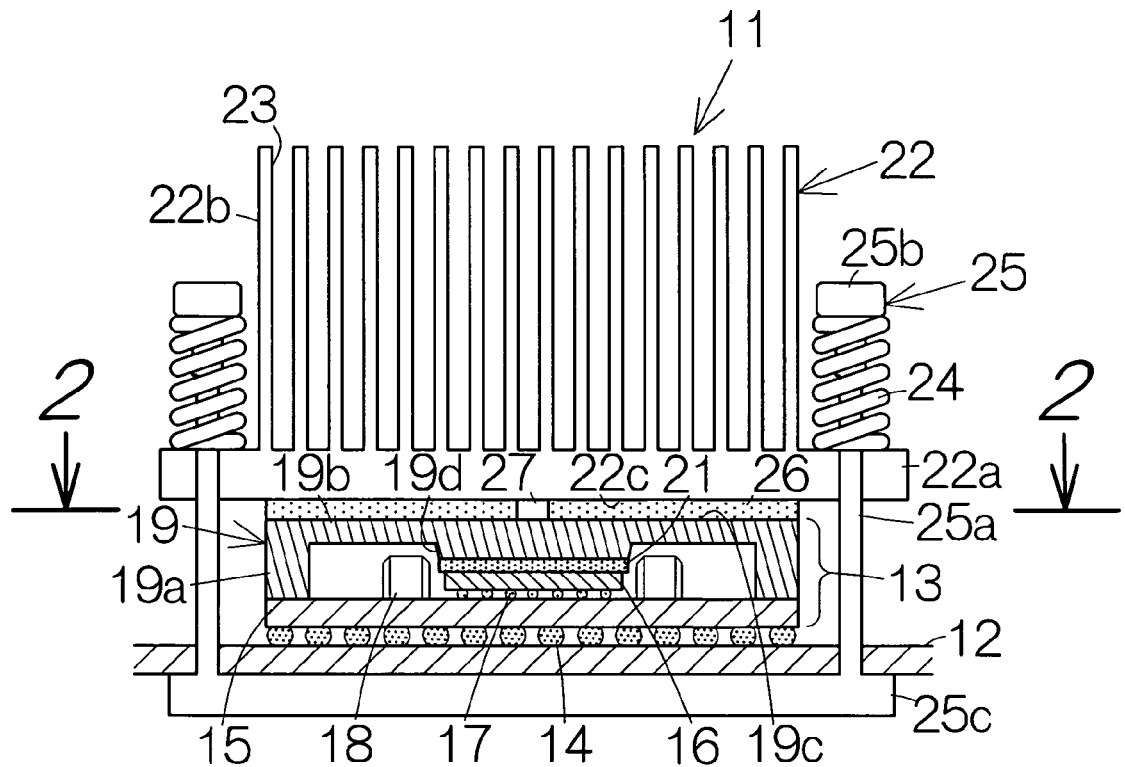
FIG. 1 is an enlarged vertical sectional view schematically illustrating the structure of a printed circuit board unit according to a first embodiment of the present invention.

FIG. 1 schematically illustrates the structure of a printed circuit board unit 11 according to a first embodiment of the present invention. The printed circuit board unit 11 includes a printed wiring board 12. The printed wiring board 12 may includes a substrate made of a resin material. An electronic component package or LSI (Large-Scale Integrated circuit) package 13 is mounted on the printed wiring board 12. Terminal bumps 14 are employed to fix the LSI package 13 on the printed wiring board 12. The terminal bumps 14 may be made of an electrically-conductive material such as a solder material, for example.

The LSI package 13 includes a substrate 15 mounted on the front or upper surface of the printed wiring board 12. The substrate 15 may be made of a resin material, for example. An electronic component or LSI chip 16 is mounted on the front or upper surface of the substrate 15. Terminal bumps 17 are employed to fix the LSI chip 16 on the substrate 15. The terminal bumps 17 may be made of an electrically-conductive material such as a solder material, for example. Capacitors 18 may be mounted on the front or upper surface of the substrate 15 in the vicinity of the LSI chip 16. A ceramic substrate may alternatively be employed as the substrate 15.

The LSI package 13 includes a heat spreading member or heat spreader 19 received on the upper surface of the LSI chip 16. The heat spreader 19 comprises a surrounding wall 19a and a flat ceiling plate 19b. The surrounding wall 19a stands upright in the vertical direction from the upper surface of the substrate 15. The surrounding wall 19a is designed to surround the LSI chip 16 and the capacitors 18. The flat ceiling plate 19b is coupled to the upper end of the surrounding wall 19a. The lower end of the surrounding wall 19a is firmly fixed to the upper surface of the substrate 15. An adhesive may be employed to fix the surrounding wall 19a. The flat ceiling plate 19b defines a flat upward surface 19c. The surrounding wall 19a and the flat ceiling plate 19b cooperate to define an inner space.

The flat ceiling plate 19b of the heat spreader 19 has an extent larger than the upper surface of the LSI chip 16 on the substrate 15. Specifically, the heat spreader 19 completely covers over the LSI chip 16. The heat spreader 19 may be made of a heat conductive material such as copper, aluminum, aluminum carbide, silicon carbide, aluminum silicon carbide (AlSiC), or the like.

As is apparent from FIG. 1, a solidified material or mass 21 having a predetermined heat conductivity is interposed between the upper surface of the LSI chip 16 and the flat ceiling plate 19b of the heat spreader 19. Silver paste, diamond paste, or the like, may be employed to form the solidified material 21, for example. In this case, a swell 19d may be formed on the lower surface of the flat ceiling plate 19b. The swell 19d allows the downward surface of the flat ceiling plate 19b to sufficiently approach the LSI chip 16 without contacting with the capacitors 18.

A heat radiation member or heat sink 22 is received on the flat upper surface of the heat spreader 19 or LSI package 13. The heat sink 22 includes a plate-shaped main body or heat plate 22a and fins 22b standing upright in the vertical direction from the heat plate 22a. The heat plate 22a is designed to oppose a flat downward surface or opposed surface 22c to the flat upper surface 19c of the heat spreader 19. Air passages 23 are defined between the individual adjacent pairs of the fins 22b. The air passages 23 extend in parallel with one another. The heat sink 22 may be molded out of a metallic material such as aluminum, copper, or the like.

Coil springs 24 are coupled to the heat sink 22. The coil springs 24 are designed to shrink and elongate in the vertical direction based on its own elasticity. The lower ends of the coil springs 24 are supported on the upper surface of the heat sink 22. The elasticity of the coil springs 24 serves to distance the upper ends of the coil springs 24 from the heat sink 22. A restraint member 25 is coupled to the upper ends of the individual coil springs 24 so as to restrain the movement of the upper end of the coil spring 24 in the direction distanced from the printed wiring board 12. The elasticity of the coil springs 24 serves to urge the heat sink 22 in the direction toward the printed wiring board 12. In this case, the restraint member 25 may include four attachment shafts 25a penetrating through the printed wiring board 12 as well as the heat sink 22, for example. A nut 25b is coupled to the tip end of the individual attachment shaft 25a. The individual nut 25b defines a downward surface opposed to the heat sink 22. The downward surface of the nut 25b receives the upper end of the corresponding coil spring 24. The attachment shafts 25a are coupled to an anchoring member or frame 25c located at the back or lower surface of the printed wiring board 12. The heat sink 22, the coil springs 24 and the restraint member 25 in combination establish an urging mechanism according to the present invention.

Fluid having a predetermined heat conductivity such as thermal grease 26 is interposed between the flat upper surface 19c of the heat spreader 19 and the opposed surface 22c of the heat sink 22. The thermal grease 26 includes silicone grease and fine particles dispersed in the silicone grease. The fine particles have a predetermined heat conductivity. The fine particles thus serve as heat conductive filler 32. Ceramic particles, metallic particles, or the like, may be employed as the heat conductive filler 32, for example. Alternatively, a heat conductive sheet, heat conductive gel, or the like, may be interposed between the flat upper surface 19c of the heat spreader 19 and the opposed surface 22c of the heat sink 22.

A contact piece 27 is also interposed between the flat upper surface 19c of the heat spreader 19 and the opposed surface 22c of the heat sink 22. The opposed surface 22c of the heat sink 22 gets opposed to the flat upper surface 19c of the heat spreader 19 at a position around the contact piece 27. The contact piece 27 may contact with the flat upper surface 19c of the heat spreader 19 over a contact area smaller than the upper surface of the LSI chip 16. The contact piece 27 may likewise contact with the opposed surface 22c of the heat sink 22 over a contact area smaller than the upper surface of the LSI chip 16.

A metallic mass may be employed as the contact piece 27. The metallic mass may be a thin plate of 1 mm square having the thickness of 100 mµ approximately, for example. Alternatively, the metallic mass may be a disk, a ball, or the like. The metallic mass may be made of a metallic material such as aluminum, copper, or the like. The assembly of the LSI package 13 and the contact piece 27 form an electronic component package assembly according to the present invention.

Figure 2:
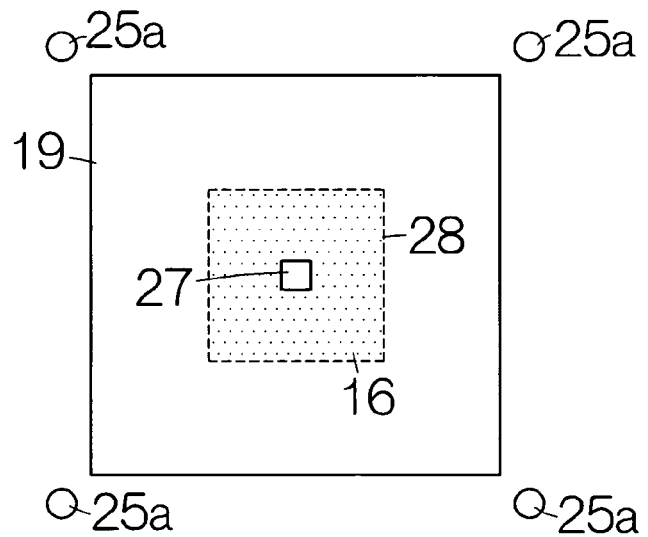
FIG. 2 is an enlarged sectional view taken along the line 2-2 in FIG. 1 for schematically illustrating the location of a contact piece on the upper surface of a heat spreader.

As shown in FIG. 2, the contact piece 27 may contact with the flat upper surface 19c of the heat spreader 19 at a section 28 defined on the upper surface of the heat spreader 19 based on the projected image of the LSI chip 16. In this case, the projected image of the LSI chip 16 is established based on a projection of the LSI chip 16 in the direction vertical to the upper surface of the heat spreader 19.

As described above, when the urging force is applied to the heat sink 22, the urging force acts on the heat spreader 19 through the contact piece 27. The urging force concentrates at the contact area between the flat upper surface 19c of the heat spreader 19 and the contact piece 27. Since the urging force concentrates on the flat ceiling plate 19b at a position sufficiently remoter from the surrounding wall 19a, the heat spreader 19 is reliably urged against the upper surface of the LSI chip 16.

The LSI chip 16 generates heat during the operation. The generated heat is transferred to the heat spreader 19 through the solidified material 21. The heat is allowed to spread over a larger or wider area of the heat spreader 19. The spread heat is then transferred to the heat sink 22 through the thermal grease 26. The heat sink 22 enables radiation of the heat into air from a larger exposed surface. The LSI chip 16 is in this manner effectively prevented from a rise in temperature.

The heat of the LSI chip 16 is simultaneously transferred to the substrate 15. The substrate 15 exhibits a larger thermal expansion as compared with the LSI chip 16 and the heat spreader 19. Since the urging force is applied to the heat spreader 19 and the LSI chip 16 over a smaller area because of the contact piece 27, the heat spreader 19 and the LSI chip 16 are reliably prevented from suffering from camber. Separation is in this manner reliably avoided between the heat spreader 19 and the solidified material 21. The heat spreader 19 and the solidified material 21 reliably keep contacting with each other, so that the LSI chip 16 is sufficiently suppressed from a rise in temperature. In the case where the flat upper surface 19c of the heat spreader 19 is simply opposed to the opposed surface 22c of the heat sink 22 without interposal of the contact piece 27 in a conventional manner, the heat spreader 19 and the LSI chip 16 tend to suffer from camber in response to a rise in temperature of the LSI chip 16. Such camber leads to separation between the heat spreader 19 and the solidified material 21. The inventor has revealed that the separation of the heat spreader 19 off the solidified material 21 due to the camber in this manner results in a rapid rise in temperature of the LSI chip 16 beyond the permissible operating temperature range.

Figure 3:
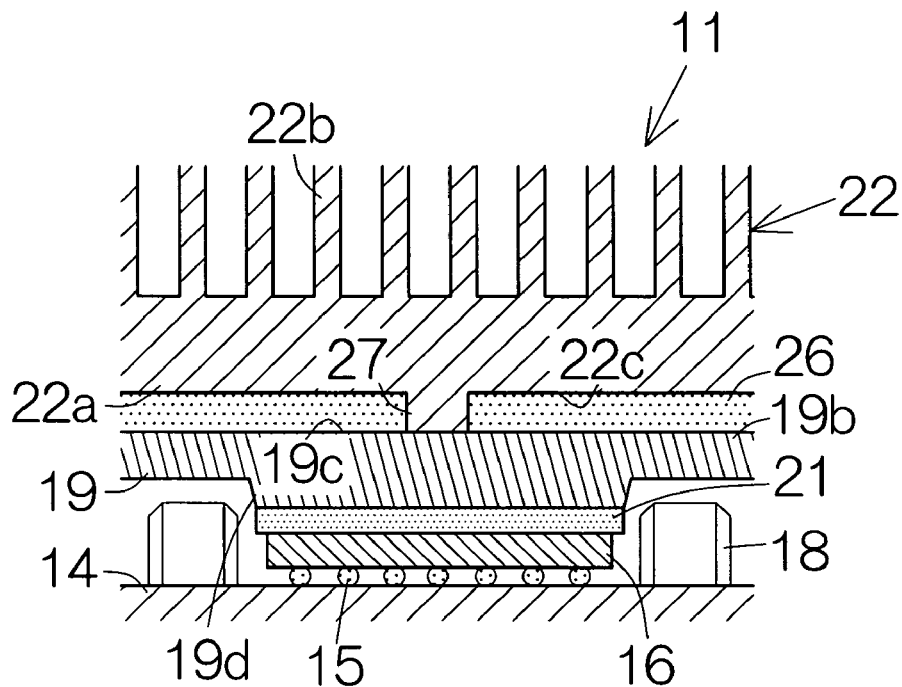
FIG. 3 is an enlarged partial vertical sectional view schematically illustrating the structure of a printed circuit board unit according to a second embodiment of the present invention.

As shown in FIG. 3, the aforementioned contact piece 27 may be formed integral with the heat sink 22 as a one-piece component in the printed circuit board unit 11. Like reference numerals are attached to structure or components equivalent to those of the aforementioned first embodiment. Here, the contact piece 27 is formed on the opposed surface 22c of the heat sink 22. The contact piece 27 contacts with the flat upper surface 19c of the heat spreader 19 over a contact area smaller than the upper surface of the LSI chip 16. The contact piece 27 may contact with the flat upper surface 19c of the heat spreader 19 at a section defined on the flat upper surface 19c of the heat spreader 19 based on the projected image of the LSI chip 16. Machining may be employed to form the contact piece 27 on the heat sink 22, for example. Alternatively, etching process may be employed to configure the contact piece 27.

Figure 4:
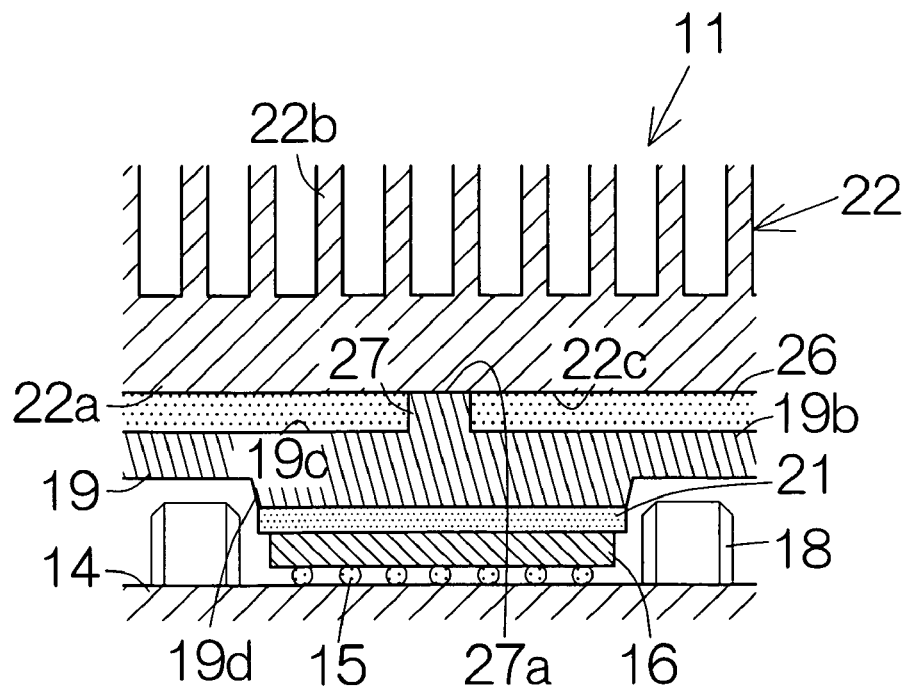
FIG. 4 is an enlarged partial vertical sectional view schematically illustrating the structure of a printed circuit board unit according to a third embodiment of the present invention.

As shown in FIG. 4, the contact piece 27 may be formed integral with the heat spreader 19 into a one-piece component. Like reference numerals are attached to structure or components equivalent to those of the aforementioned first embodiment. In this case, the contact piece 27 is formed on the flat upper surface 19c of the heat spreader 19. The flat upper surface 19c provides an upward surface having an outer periphery extending in an imaginary plane. The contact piece 27 is designed to define an upper end 27a located above the imaginary plane. The upper end 27a swells from the flat upper surface 19c. The extent of the upper end 27a is set smaller than the upper surface of the LSI chip 16. The upper end 27a may be located in a section defined on the flat upper surface 19c of the heat spreader 19 based on the projected image of the LSI chip 16. The upper end 27a likewise contacts with the opposed surface 22c of the heat sink 22 in a section defined on the opposed surface 22c of the heat sink 22 based on the projected image of the LSI chip 16. Machining may be employed to form the contact piece 27 on the heat spreader 19, for example. Alternatively, etching process may be employed to form the contact piece 27.

Figure 5:
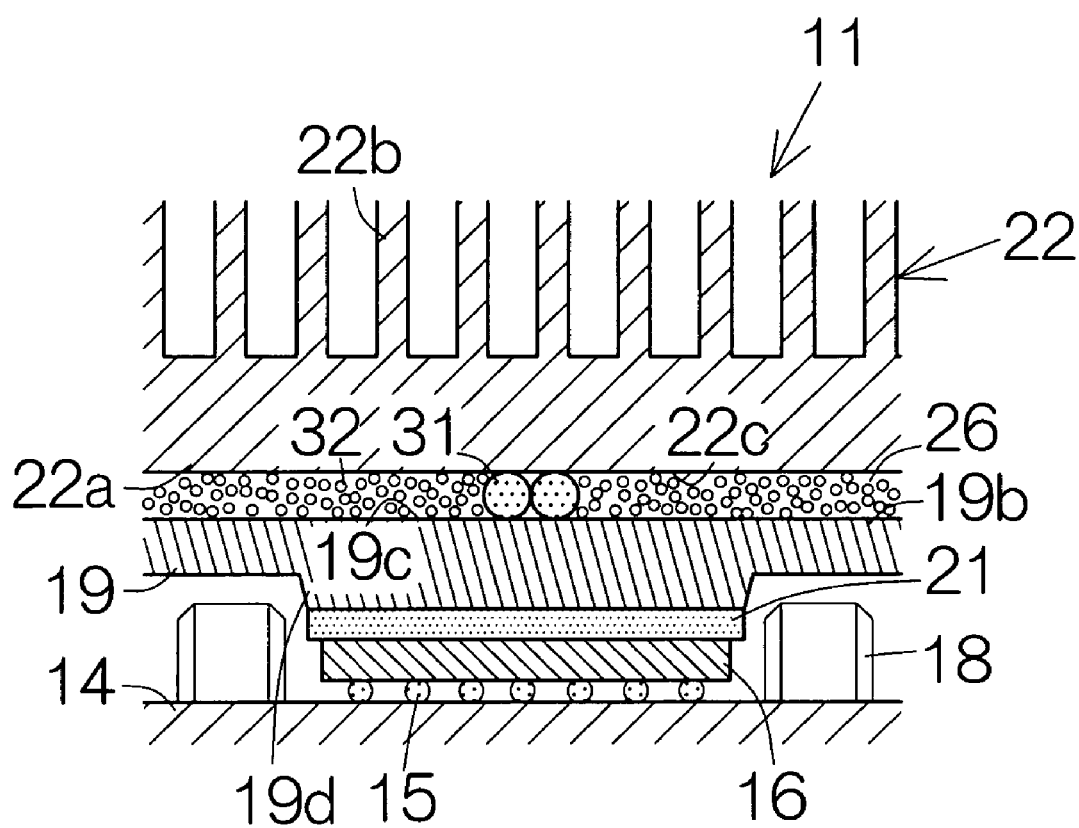
FIG. 5 is an enlarged partial vertical sectional view schematically illustrating the structure of a printed circuit board unit according to a fourth embodiment of the present invention.

As shown in FIG. 5, grains 31 may be employed as the aforementioned contact piece 27. Like reference numerals are attached to structure or components equivalent to those of the aforementioned first embodiment. The grains 31 may have a size larger than those of the fine particles as the heat conductive filler 32. Ceramic grains, metallic grains, or the like, may be employed as the grains 31, for example. The grains 31 contact with the flat upper surface 19c of the heat spreader 19 over a contact area smaller than the upper surface of the LSI chip 16. The grains 31 may contact with the flat upper surface 19c of the heat spreader 19 in a section defined on the flat upper surface 19c of the heat spreader 19 based on the projected image of the LSI chip 16, for example. The grains 31 may likewise contact with the opposed surface 22c of the heat sink 22 over a contact area smaller than the upper surface of the LSI chip 16.

What is claimed is:

1. An electronic component package assembly comprising:
    a heat spreading member received on a predetermined surface of an electronic component, said heat spreading member defining a flat upper surface having four corners, the flat upper surface extending larger than the predetermined surface of the electronic component;
    a plate member opposed to the flat upper surface of the heat spreading member;
    an urging mechanism connected to the plate member, the urging mechanism including coil springs located outside the corners of the flat upper surface, said coil springs applying an urging force to the plate member toward the surface of the electronic component; and
    a contact piece interposed between the plate member and the flat upper surface of the heat spreading member, said contact piece contacting with the flat upper surface over a contact area remoter from the corners.

2. The electronic component package assembly according to claim 1, wherein the contact piece contacts with the flat upper surface of the heat spreading member in a section defined on the flat upper surface of the heat spreading member based on a projected image of the electronic component.

3. The electronic component package assembly according to claim 1, wherein said plate member receiving fins standing upright from the plate member so as to establish a heat radiation member.

4. The electronic component package assembly according to claim 3, wherein the contact piece is integral with the heat radiation member so as to establish a one-piece component.

5. The electronic component package assembly according to claim 3, wherein a heat conductive grease or gel is interposed between the flat upper surface of the heat spreading member and the heat radiation member.

6. The electronic component package assembly according to claim 3, comprising:
    a fluid, selected from grease or gel, interposed between the flat upper surface of the heat spreading member and the heat radiation member;
    fine particles having heat conductivity, said fine particles dispersed in the fluid; and
    a grain existing in the fluid, said grain having a size larger than that of the fine particles so as to serve as the contact piece in the fluid.

7. The electronic component package assembly according to claim 1, wherein the contact piece is a metallic mass.

8. The electronic component package assembly according to claim 1, wherein a solidified material having heat conductivity is interposed between the predetermined surface of the electronic component and the heat spreading member.

9. An electronic component package assembly comprising:
    a printed wiring board;
    an electronic component mounted on a surface of the printed wiring board;
    a heat spreading member received on a surface of the electronic component on the printed wiring board, said heat spreading member defining a flat upward surface extending in an imaginary plane, the flat upward surface having four corners;
    a plate member opposed to the flat upward surface of the heat spreading member;
    an urging mechanism connected to the plate member, the urging mechanism including coil springs located outside the corners of the flat upward surface, said coil springs applying an urging force to the plate member toward the surface of the electronic component; and
    a contact piece integrally formed on the flat upward surface of the heat spreading member, said contact piece defining an upper end located above the imaginary plane so as to receive the plate member over a contact area remoter from the corners.

10. The electronic component package assembly according to claim 9, wherein the upper end of the contact piece is located in a section defined on the upper surface of the heat spreading member based on a projected image of the electronic component.

11. The electronic component package assembly according to claim 9, wherein the heat spreading member defines a flat surface at a position adjacent to the contact piece.

12. The electronic component package assembly according to claim 9, further comprising a solidified material having heat conductivity, said solidified material interposed between the surface of the electronic component and the heat spreading member.

13. A printed circuit board unit comprising:
a printed wiring board;
an electronic component package mounted on a surface of the printed wiring board, said electronic component package allowing a heat spreading member to cover over an electronic component, said heat spreading member defining a flat upper surface having four corners, the flat upper surface extending larger than a predetermined surface of the electronic component;
a heat radiation member defining a flat surface opposed to the flat upper surface of the heat spreading member;
an urging mechanism connected to the heat radiation member, the urging mechanism including coil springs located outside the corners of the flat upper surface, said coil springs applying an urging force to the heat radiation member toward the flat upper surface of the heat spreading member; and
a contact piece interposed between the heat radiation member and the flat upper surface of the heat spreading member, said contact piece contacting with the flat upper surface over a contact area remoter from the corners.

14. The printed circuit board unit according to claim 13, wherein the contact piece contacts with the flat upper surface of the heat spreading member in a section defined on the flat upper surface of the heat spreading member based on a projected image of the electronic component.

15. A printed circuit board unit comprising:
a printed wiring board;
an electronic component package mounted on a surface of the printed wiring board, said electronic component package allowing a heat spreading member to cover over an electronic component, said heat spreading member defining a flat upward surface having four corners, the flat upward surface extending larger than a predetermined surface of the electronic component;
a heat radiation member defining a flat opposed surface opposed to the flat upward surface of the heat spreading member;
an urging mechanism connected to the heat radiation member the urging mechanism including coil springs located outside the corners of the flat upward surface, said coil springs applying an urging force to the heat radiation member toward the flat upward surface of the heat spreading member; and
a contact piece protruding from the flat upward surface of the heat spreading member, said contact piece receiving the flat opposed surface of the heat radiation member over a contact area remoter from the corners.

16. The electronic component package assembly according to claim 1, wherein the heat spreading member comprises:
a flat ceiling plate received on the electronic component; and
a surrounding wall standing upright in a vertical direction so as to surround the electronic component.

17. The electronic component package assembly according to claim 9, wherein the heat spreading member comprises:
a flat ceiling plate received on the electronic component; and
a surrounding wall standing upright in a vertical direction so as to surround the electronic component.

* * * * *